US008850137B2

(12) United States Patent
Nazar et al.

(10) Patent No.: US 8,850,137 B2
(45) Date of Patent: Sep. 30, 2014

(54) MEMORY SUBSYSTEM FOR COUNTER-BASED AND OTHER APPLICATIONS

(75) Inventors: Shadab Nazar, Sunnyvale, CA (US); Mainak Sen, Fremont, CA (US); Wing L. Ho, Fremont, CA (US); Ananda Shah, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 686 days.

(21) Appl. No.: 12/901,872

(22) Filed: Oct. 11, 2010

(65) Prior Publication Data

US 2012/0089793 A1 Apr. 12, 2012

(51) Int. Cl.
*G06F 12/00* (2006.01)
*G11C 7/10* (2006.01)

(52) U.S. Cl.
CPC ........... *G11C 7/1006* (2013.01); *Y02B 60/1225* (2013.01)
USPC .................................. 711/155; 711/E12.001

(58) Field of Classification Search
USPC ........................................... 711/155, E12.001
See application file for complete search history.

(56) References Cited

U.S. PATENT DOCUMENTS

| 5,167,029 | A | 11/1992 | Eikill et al. |
|---|---|---|---|
| 5,371,875 | A | 12/1994 | Eikill et al. |
| 5,546,343 | A | 8/1996 | Elliott et al. |
| 5,687,173 | A | 11/1997 | Melden et al. |
| 5,825,770 | A | 10/1998 | Coady et al. |
| 5,899,576 | A * | 5/1999 | Fukuzawa ...................... 386/279 |
| 6,308,220 | B1 | 10/2001 | Mathur |
| 6,424,658 | B1 | 7/2002 | Mathur |
| 6,460,120 | B1 | 10/2002 | Bass et al. |
| 6,484,224 | B1 | 11/2002 | Robins et al. |
| 6,892,285 | B1 | 5/2005 | Key et al. |
| 6,941,308 | B1 * | 9/2005 | Chilton ................................. 1/1 |

(Continued)

FOREIGN PATENT DOCUMENTS

WO 2008117042 A2 10/2008

OTHER PUBLICATIONS

Herming Chiueh et al., "The Address Translation Unit of the Data-Intensive Architecture (DIVA) System," Proceedings of the 28th European Solid-State Circuit Conference, Sep. 2002.

(Continued)

*Primary Examiner* — Mardochee Chery
(74) *Attorney, Agent, or Firm* — Edell, Shapiro & Finnan, LLC

(57) ABSTRACT

A memory device and related techniques are provided to modify data stored in the memory device without the need to send the data to an external device. A command is received at the memory device to modify data stored at a memory location in a memory array of the memory device. The command includes a value to be used for modifying the data. The memory device reads data from the memory location. The data read from the memory location is modified with modify circuit in the memory device based on the value obtained form the command to produce results data. The results data produced by the modify circuit is written back to the memory location. Since the memory device does not need to send the data read from the memory array off-chip to another device, referred to herein as a host device, to update the data, the input/output bandwidth of the bandwidth is substantially reduced, allowing for lower power memory device operation and reduced latency.

18 Claims, 8 Drawing Sheets

(56) References Cited

U.S. PATENT DOCUMENTS

| | | | |
|---|---|---|---|
| 7,000,055 B1 | 2/2006 | Robins et al. | |
| 7,006,505 B1 | 2/2006 | Bleszynski et al. | |
| 7,304,942 B1 | 12/2007 | Malladi et al. | |
| 7,304,999 B2 | 12/2007 | Sukonik et al. | |
| 7,599,287 B2 | 10/2009 | Testa et al. | |
| 7,657,706 B2 | 2/2010 | Iyer et al. | |
| 7,684,257 B1 | 3/2010 | Lee et al. | |
| 7,739,426 B1 | 6/2010 | Steiss et al. | |
| 7,895,412 B1 | 2/2011 | Kerr et al. | |
| 8,270,401 B1 | 9/2012 | Barnes et al. | |
| 2003/0043664 A1* | 3/2003 | Haraguchi et al. | 365/201 |
| 2003/0120880 A1* | 6/2003 | Banno | 711/155 |
| 2004/0095838 A1* | 5/2004 | Li | 365/233 |
| 2005/0169291 A1 | 8/2005 | Key et al. | |
| 2006/0031565 A1 | 2/2006 | Iyer et al. | |
| 2006/0050690 A1 | 3/2006 | Epps et al. | |
| 2006/0123139 A1 | 6/2006 | Iyer et al. | |
| 2007/0195773 A1 | 8/2007 | Tatar et al. | |
| 2008/0117913 A1 | 5/2008 | Tatar et al. | |
| 2008/0126507 A1 | 5/2008 | Wilkinson | |
| 2009/0046724 A1 | 2/2009 | Lynch et al. | |
| 2009/0063702 A1 | 3/2009 | Holst et al. | |
| 2009/0122805 A1 | 5/2009 | Epps et al. | |
| 2010/0185919 A1 | 7/2010 | Lawson et al. | |
| 2010/0185926 A1 | 7/2010 | Lawson et al. | |
| 2010/0195663 A1 | 8/2010 | Sharma et al. | |
| 2011/0082981 A1* | 4/2011 | Hoogerbrugge et al. | 711/119 |
| 2011/0191548 A1* | 8/2011 | Miller et al. | 711/153 |
| 2011/0289349 A1 | 11/2011 | Loeser et al. | |
| 2012/0117317 A1* | 5/2012 | Sheffler | 711/103 |

OTHER PUBLICATIONS

Richard Crisp, "Direct RAMbus Technology: The New Main Memory Standard," Micro, IEEE, Nov./Dec. 1997, vol. 17, Issue 6, pp. 18-28.

Jeff Draper et al., "The Architecture of the DIVA Processing in Memory Chip," International Conference on Supercomputing, Jun. 2002.

Jeffrey Draper et al., "Implementation of a 32-bit RISC Processor for the Data-Intensive Architecture Processing-In-Memory Chip," 13th IEEE International Conference on Application-Specific Systems, Architectures and Processors (ASAP'02), Jul. 17-Jul. 19, 2002, San Jose, California.

Jeffrey Draper et al., "A Prototype Processing-In-Memory (PIM) Chip for the Data-Intensive Architecture (DIVA) System," Journal of VLSI Signal Processing Systems Archive, vol. 40, Issue 1, pp. 73-84.

Pierre Guerrier et al., "A Generic Architecture for On-Chip Packet Packet-Switched Interconnections," IEEE Conf. Proceedings, Mar. 2000, pp. 250-256.

Bjorn Liljeqvist, "Visions and Facts—A Survey of Network Processors," Master's Thesis, Electrical Engineering Program, Chalmers University of Technology, Department of Computer Engineering, Goteborg, Sweden, 2003.

Ken Mai et al., "Smart Memories: A Modular Reconfigurable Architecture," International Conference on Supercomputing, Jun. 2000.

Ioannis Mavroidis, "The IRAM Network Interface," Report No. UCB/CSD-00-1111, Sep. 2000, Computer Science Division (EECS), University of California Berkeley, California 94720.

Steven Melvin et al., "A Massively Multithreaded Packet Processor," Workshop on Network Processors—NP2, Held in conjunction with the 9th International Symposium on High-Performance Computer Architecture, Feb. 8-9, 2003.

Mike O'Connor, "The iFlow Address Processor," Micro, IEEE, vol. 21, No. 2, pp. 16-23, Mar./Apr. 2001.

Leonid Oliker et al., "Evaluation of Architectural Paradigms for Addressing the Processor-Memory Gap," Lawrence Berkeley National Laboratory, 2003, LBNL Paper LBNL-54907, retrieved from: http://www.escholarship.org/uc/item/5s59f02m.

Peter Sassone, "Commercial Trends in Off-Chip Communication," Technical Report, Georgia Institute of Technology, May 2003.

Devavrat Shah et al., "Analysis of a Statistics Counter Architecture," IEEE Computer Society, Washington, DC, USA, Proceedings of the Ninth Symposium on High Performance Interconnects, 2001, p. 107.

Mark Thorson, "Smart Memory," Internet Nuggets, eee@netcom.com, Jun. 1995.

Jan Van Lunteren, "Searching Very Large Routing Tables in Wide Embedded Memory," Proceedings of the IEEE Global Telecommunications Conference GLOBECOM'01, vol. 3, pp. 1615-1619, San Antonio, Texas, Nov. 2001.

International Search Report and Written Opinion in counterpart International Application No. PCT/US2011/031911, mailed Nov. 17, 2011.

Extended European Search Report in counterpart European Application No. 11832891.3, mailed Mar. 4, 2014, 6 pages.

* cited by examiner

US 8,850,137 B2

MEMORY SUBSYSTEM FOR COUNTER-BASED AND OTHER APPLICATIONS

TECHNICAL FIELD

The present disclosure generally relates to a memory subsystem that is useful in applications that require numerous counting and similar compute operations.

BACKGROUND

In wired and wireless networking environments, performance of the network is monitored with the use of network analyzer devices. Network analyzer devices use counters to store information about network flows and other statistical measures related to traffic in a network. These counters are used for traffic policing, debugging failures, network monitoring and various other analysis and measurement functions.

When the number of counters in the device is very large, the cost and die-area to store the counters on-chip becomes prohibitive. Off-chip dynamic random access memory (DRAM) devices with caching algorithms can be used to solve this problem to allow for updating of the counters at the line-rate. However, using a standard DRAM device requires a higher input/output (I/O) bandwidth, a higher power to support the greater bandwidth and a long read-modify-write latency to support the exchanges between the memory device that stores the counters and the host device that updates the counters.

DESCRIPTION OF EXAMPLE EMBODIMENTS

Overview

A memory device and related techniques are provided to modify data stored in the memory device without the need to send the data to an external device. The memory device is useful as a stand-alone memory and as a network counter cache. A command is received at the memory device to modify data stored at a memory location in a memory array of the memory device. The command includes a value to be used for modifying the data. The memory device reads data from the memory location. The data read from the memory location is modified with modify circuit in the memory device based on the value obtained form the command to produce results data. The results data produced by the modify circuit is written back to the memory location. Since the memory device does not need to send the data read from the memory array off-chip to another device, referred to herein as a host device, to update the data, the input/output bandwidth of the bandwidth is substantially reduced, allowing for lower power memory device operation and reduced latency.

Example Embodiments

Figure 1:
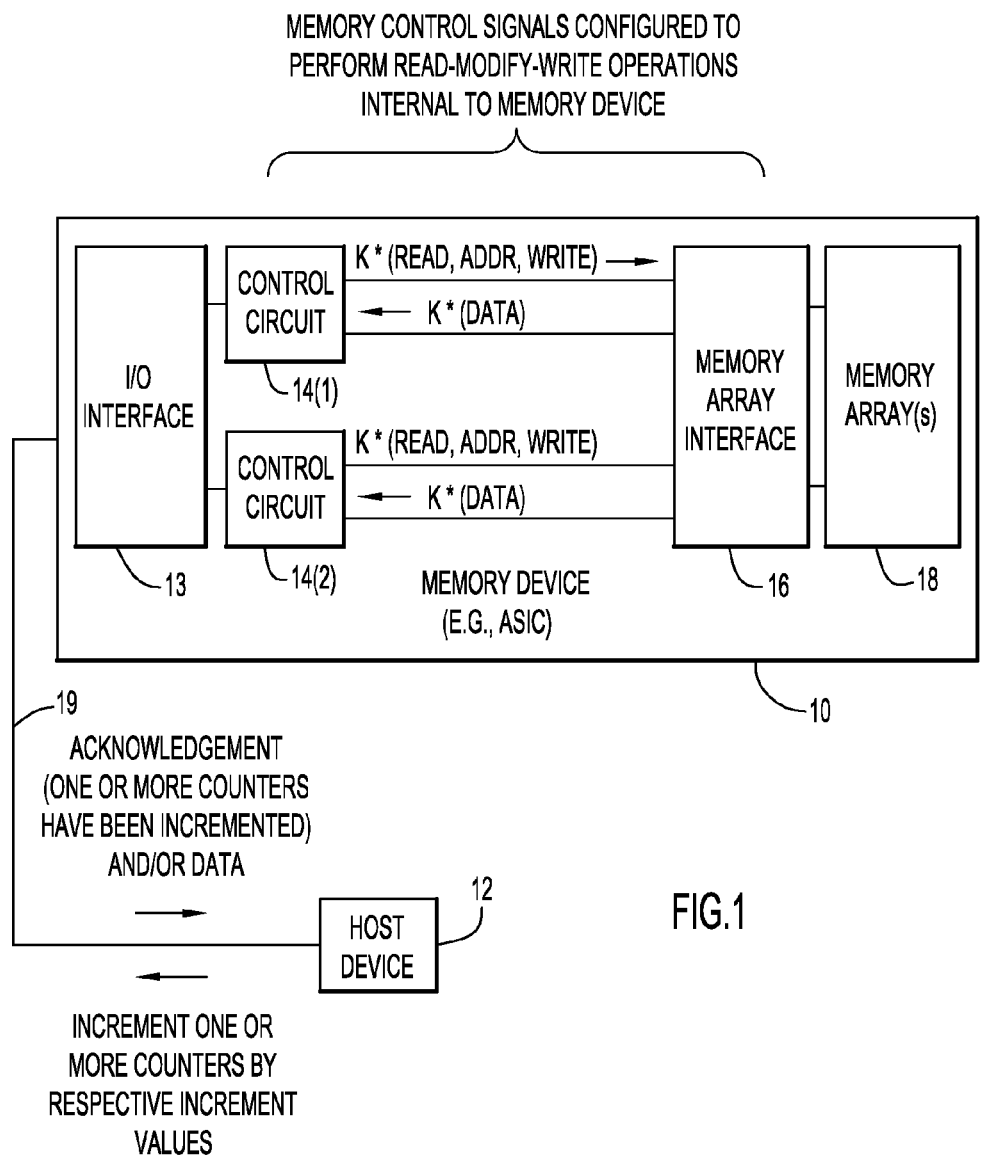
FIG. 1 is an example of a block diagram of a memory device configured to internally perform modify operations on data stored in the memory device as part of a Read-Modify-Write operational sequence in response to a command received from an external host device.

Referring first to FIG. 1, a memory device is shown at reference numeral 10 that is configured to perform Read-Modify-Write operations. The memory device 10 is configured to interface with a host device 12 and receive commands from the host device 12 to access data stored in the memory device 10. More specifically, the memory device 10 is configured to internally perform operations on stored data that would otherwise be performed by the host device 12 and consequently reduce the amount of data that the memory device 10 needs to supply back to the host device 12. This reduces the input/output bandwidth requirements between the memory device 10 and the host device 12.

To this end, the memory device 10 comprises an input/output interface 13, control circuits 14(1) and 14(2), a memory array interface 16 and one or more memory arrays 18 comprising a plurality of memory cells configured to store data. The memory arrays 18 serve as a means for storing data in a plurality of memory cells. In one form, the memory arrays 18 comprise embedded Dynamic Random Access Memory (eDRAM) arrays. The memory arrays 18 may be any DRAM such as a synchronous DRAM (SRAM) or other type of memory storage array, now known or hereinafter developed. The memory arrays 18 comprise the memory cells that store the data in the memory device 10. The input/output interface 13 is configured to receive commands from the host device 12 and to supply data or an acknowledgment from the memory device 10 to the host device 12 by way of a bus or other suitable connection shown at reference numeral 19. Thus, the input/output interface 13 serves as a means for receiving a command to access data in the memory arrays 19. The input/output interface 13 may be external to the memory device 10 per se on a separate device or implemented in the same integrated circuit as the memory device 10. The control circuits 14(1) and 14(2) are each configured to generate memory control signals to access the memory arrays 18 via the memory array interface 16. FIG. 1 shows that the memory device 10 comprises two control circuits but this is only an example; there may be a single control circuit or more than two control circuits.

The input/output interface 13 is, for example, implemented by appropriate digital logic circuitry (and any supporting analog circuitry) to receive incoming commands and associated data and to output responses and data from the memory device 10. Likewise, the memory array interface is implemented, for example, by digital logic circuitry (and any supporting analog circuitry) to send commands to and receive data stored in the memory array(s) 18.

Each control circuit 14(1) and 14(2) is configured to interpret a command received from the host device 12 and to generate memory control signals to perform at least one, but more generally, K plurality of transactions involving Read, Address (Addr), and Write signals to retrieve data at K memory locations in the memory arrays 18 and write results data from modify operation on the data back to the K memory locations in the memory arrays 18. Thus, control circuit 14(1) is configured to generate K*(Read, Addr, Write) signals for accessing K memory locations in memory arrays 18 to retrieve K*(Data) at K different memory locations in memory arrays 18. Control circuit 14(2) operates identically to control circuit 14(1). There may be times during operation of the memory device 10 that both control circuits 14(1) and 14(2) are operating at the same time with respect to the memory arrays 18 and other times where one of the control circuits may be disabled. As explained hereinafter, each control circuit serves as a controlling means configured to generate memory control signals from the command to be supplied to the memory arrays 18 to read data from the memory arrays 18 and write data back to the memory arrays, and comprising means for modifying data read from the memory arrays 18 based on a value contained in the command to produce results data and to write the results data back to the memory arrays 18.

According to one example described herein, the host device 12 supplies commands comprising increment values to increment one or more counters represented by data stored in corresponding memory locations. This is only one example of the operations that the memory device 10 may perform. Non-limiting examples of other operations that the memory device 10 may perform include multiply, divide, subtract, etc.

The memory device 10 may be implemented as an application specific integrated circuit (ASIC) device. The host device 12 may comprise one or more ASICs, processors, and any combination of digital circuitry and analog circuitry configured to perform desired functions or applications with the use of the memory device 10. Depending on the operation that the host device 12 requests of the memory device 10, the memory device 10 responds with an acknowledgement (ACK), e.g., that one or more counters have been incremented, and/or data stored in the memory device 10.

Figure 2:
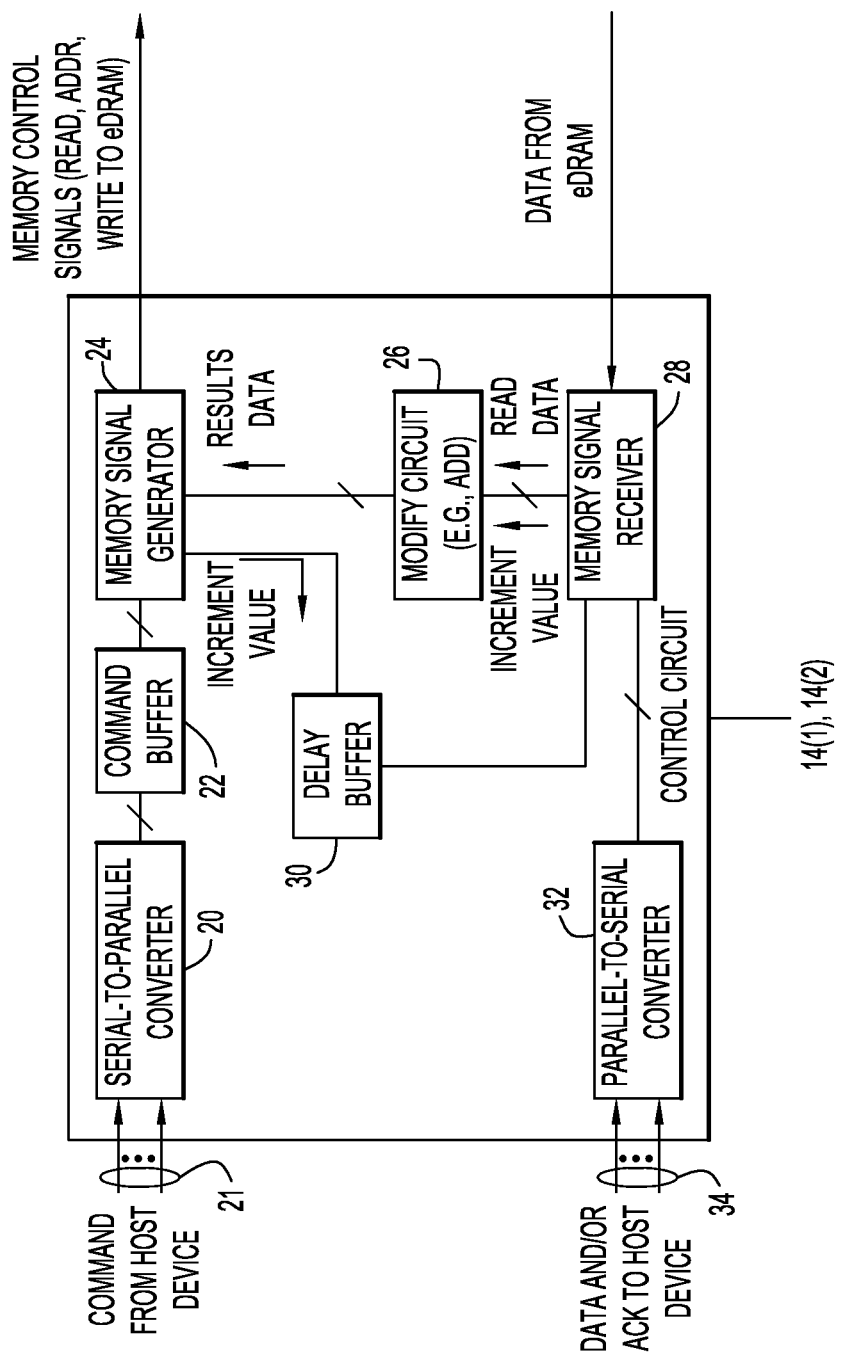
FIG. 2 is an example of a block diagram of a control circuit in the memory device that is configured to generate the control signals for the Read-Modify-Write operational sequence.

Reference is now made to FIG. 2. FIG. 2 illustrates an example of a block diagram of the control circuits 14(1) and 14(2). Control circuits 14(1) and 14(2) have the same structure. Each control circuit 14(1) and 14(2) comprises a serial-to-parallel converter circuit 20, a command buffer circuit 22, a memory signal generator circuit 24, a memory signal receiver circuit 26, a modify circuit 28, a delay buffer circuit 30 and a parallel-to-serial converter circuit 32. All of the circuits shown as part of the control circuits 14(1) and 14(2) are implemented by digital logic gates, registers, counters, etc., and any supporting analog circuitry, for example, to perform the operations described herein. Digital logic gates include AND gates, NAND gates, OR gates, Ex-OR gates, and are useful to generate control signals with desired timings to achieve read and write operations as well as to perform operations on data (e.g., Add, Multiply, Subtract, Divide, etc.) retrieved from memory. As explained hereinafter, the modify circuit 28 serves as the aforementioned means for modifying data read from the memory arrays 18 based on a value contained in command received as input to the memory device to produce results data. The buffer circuit 30 serves as a means for buffering data representing the value obtained from the command.

The serial-to-parallel converter circuit 20 receives bits in serial form on each of a plurality of lines shown at reference numeral 21, where each line shown in the figure is itself multiple bits wide. These bits that are input to the serial-to-parallel converter 20 represent at least one command (but in practical applications a plurality of commands) supplied to the memory device 10 from the host device 12. The commands may be for accessing memory locations to retrieve data as well as to perform a plurality of Read-Modify-Write operations simultaneously with respect to data stored in corresponding memory locations. The serial-to-parallel converter assembles the bits of the commands and stores them in the command buffer circuit 22.

The command buffer circuit 22 is a storage buffer that is coupled to the output of the serial-to-parallel converter 20 and stores the bits assembled by the serial-to-parallel converter 20. Some of the bits stored in the command buffer 22 represent operations to be performed (Read, Write, Read-Modify-Write, etc.) as well as values contained in the command that are to be used for a modify operation with respect to data stored in one or more memory locations in the memory arrays 18. The command buffer 22 may be implemented as a First-in-First-Out (FIFO) circuit.

The memory signal generator circuit 24 is coupled to the command buffer circuit 22 and is configured to generate memory control signals including Read signals, Write signals, Addr signals, etc., that are supplied to the memory arrays 18. In addition, the memory signal generator circuit 24 obtains any values contained in the commands in the buffer 22 that are to be used for modify operations, such as an increment data value for a counter, and supplies the bits representing these values to the delay buffer circuit 30.

The memory signal receiver circuit 26 receives data read from the memory arrays 18 and temporarily stores it, either for further processing, or to be output from the memory device 10 to the host device 12. In addition, at the completion of certain operations, such as a Read-Modify-Write operation, the memory signal receiver circuit 26 generates an ACK to the host device. The ACK serves to notify the host device 12 that the desired operation has been performed, e.g., one or more counters have been incremented.

The modify circuit 28 is configured to be coupled to the memory signal generator circuit 24 and to the memory signal receiver circuit 26. The modify circuit 28 comprises digital logic gates configured to perform any of a variety of modify operations on data read from the memory using data representing a value contained in a command received as input to the memory device 10 from the host device 12. For example, the modify circuit 28 is configured to perform an Add operation. In other examples, the modify circuit 28 is configured to perform a multiply, divide, subtract, or other operation. The modify circuit 28 generates and outputs results data from the modify operation it performs and supplies the results data to the memory signal generator circuit 24 for purposes of writing the results data back to the memory location(s) from which the data was read.

The delay buffer 30 is a storage circuit that is configured to store the data bits represents the values to be used in the modify operation as part of a Read-Modify-Write operation. Again, in one example, these bits represent an increment value, but these bits could represent other values, e.g., multiplier, divisor, decrement value, etc. The delay buffer 30 is implemented as a FIFO device in order to output a stored value to the memory signal receiver circuit 26, which then outputs the data read from a memory location to the modify circuit 28 together with the data bits representing the value to be used in the modify operation. More specifically and as will become more apparent from the following description, the delay buffer circuit 30 serves to delay the output of the bits representing the value to be used in the modify operation so that the modify circuit 28 can modify the data read from the memory location with the data representing the value stored in the buffer 30 and output the results data to the memory signal generator circuit 24 for writing back to the memory location synchronized with respect to a Write signal.

The parallel-to-serial converter circuit 32 performs an inverse operation of the serial-to-parallel converter circuit 20 with respect to data to be supplied as output from the memory device 10 to the host device 12. Bits in serial form are carried on each of a plurality of lines shown at reference numeral 34, where each line shown in the figure is itself multiple bits wide.

While the use of serial/deserial input/output is shown for the configuration of the memory device 10 in FIG. 2, this is only an example. A completely parallel interface for input and output may be used as well. The Read-Modify-Write techniques described herein are completely independent of the specific input/output interface used. Moreover, the serial-to-parallel converter 20 and the parallel-to-serial converter 32 may be implemented in the input/output interface circuit 13 instead of the control circuits. For example, the input/output interface circuit 13 may comprise a serializer/deserializer circuit that performs the serialize/deserialize functions (of the serial-to-parallel converter 20 and the parallel-to-serial converter 32) with respect to incoming commands to the memory device 10 and outgoing responses and/or data from the memory device 10. Furthermore, as explained above, the input/output interface circuit 13 may be implemented on the integrated circuit chip as the control circuits and memory arrays or in a separate integrated circuit chip.

Figure 3:
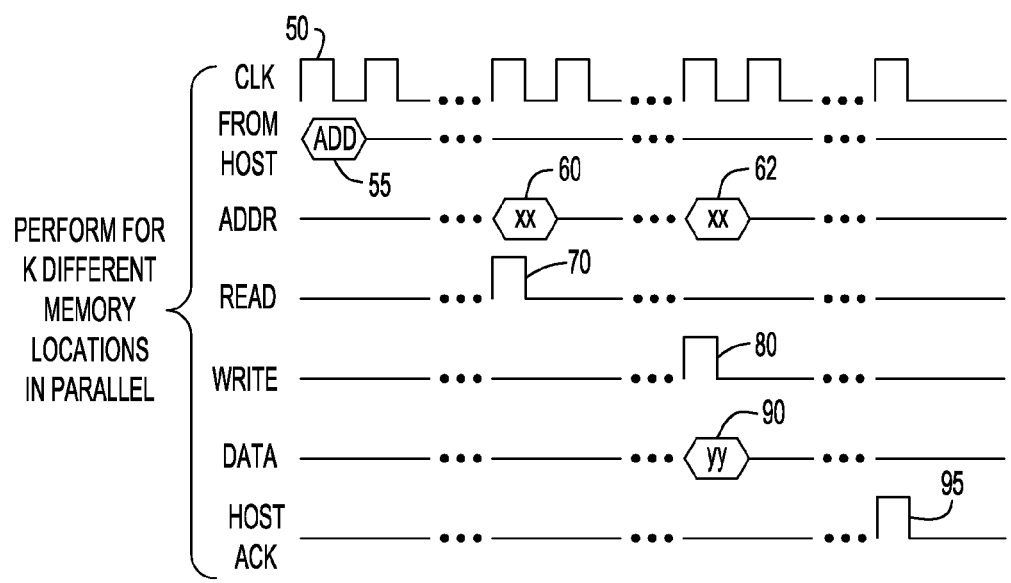
FIG. 3 is an example of a signal timing diagram for control signals generated to access memory cells in the memory device for the Read-Modify-Write operational sequence.

Reference is now made to FIG. 3, with continued reference to FIGS. 1 and 2, for a description of a signal timing diagram of the principal signals associated with the Read-Modify-Write operation internal to the memory device 10. A clock (CLK) signal is shown at 50 and is used to synchronize the various signals generated by the memory signal generator circuit 24. The clock signal 50 may be generated by a clock circuit chip that is coupled to the memory device 10, such as in the host device 12, or locally derived by the memory device 10 from a supplied clock signal.

The host device 12 initiates a Read-Modify-Write operation when it sends an Add command, for example, to increment by a specified increment value, one or more counters represented by data stored in memory locations in the memory device 10. Signal 55 is intended to represent reception of an Add command at the memory device 10 from the host device 12. The Addr, Read, Write and Data signals shown in FIG. 3 are generated by the memory signal generator circuit 24.

An Add operation involves accessing the memory arrays in the memory device 10 twice: a first time to read data from one or more memory locations and a second time to write the results of the Add operation back to the one or more memory locations. As explained above, the memory device 10 may perform K simultaneous/parallel Read-Modify-Write operations with respect to data stored at K different memory locations in the memory arrays of the memory device.

As an example, the rate of the clock signal 55 speed is 250 MHz, meaning that the memory device 10 can perform 250 million memory operations per cycle. Thus, the total number of add operations that can be performed by the memory device 10 is 125×K Million operations per cycle. In one example, an Add command comprises an address, cyclic redundancy bits, and control information bits representing a value to be added to a value represented by data stored in memory, e.g., an increment value, for example. The number of counters that can be stored in the memory device depends on the memory array sizes used in the memory arrays 18. In one example, the memory device can store several million 64 bit counters.

The address for the memory location being addressed, Addr, is shown at 60 and 62. The first time the address is supplied to the memory arrays 18 is when a Read cycle is executed. A Read cycle is performed when a Read pulse or strobe is supplied as shown at 70 and the address is supplied with a desired time synchronization with respect to the Read pulse 70. At this point, the data at the memory location corresponding to the address supplied at 60 is retrieved from the memory arrays 18 and received at the memory signal receiver circuit 26. The delay buffer 30 then outputs the bits representing the increment value to the memory signal receiver circuit 26, that in turn supplies both the data retrieved from the memory location specified by the address supplied at 60 and the value from the delay buffer 30 to the modify circuit 28. The modify circuit 28 performs the computation on the data read from the memory location with the value obtained from the command to generate the results data.

A Write cycle occurs when a Write pulse or strobe 80 is generated. The address is again supplied to the memory arrays 18 at 62 at a desired time synchronization with respect to the Write pulse 80. The results data is supplied to the memory arrays 18 at 90 in order to write the results data back to the memory location where the data was read from during the Read cycle depicted at 60 and 70.

The memory signal receiver circuit 26 receives a notification from the memory arrays 18 that the results data has been written back to the memory location and at 95 it sends an ACK signal to be supplied as output to the host device 12. The ACK serves to notify the host that the Add operation, e.g., counter increment operation, is completed.

The memory signal receiver circuit 26 is configured to output the data read from the memory location to the modify circuit 28 in sufficient time prior to an occurrence of a Write signal generated by the memory signal generator circuit 24 so that the modify circuit 28 can modify the data read from the memory location with the data representing the value stored in the delay buffer circuit 30 and output the results data to the memory signal generator circuit 24 for writing back to the memory location synchronized with respect to the Write signal.

As noted above and in FIG. 3, the Addr, Read, Write, and Data signaling are performed in parallel/simultaneously for K different memory locations, thereby allowing the memory device 10 to update K different counters in parallel during the same span of clock cycles.

In one example, the number of clock cycles needed to perform the Read-Modify-Write operational sequence is approximately 6-10 clock cycles. By contrast, if the host device 12 were to perform the mathematical operations needed to update a counter stored in the memory device 10, the number of clock cycles required is approximately 30-40. Thus, the techniques described herein save substantial time as well input/output bandwidth between the memory device 10 and the host device 12.

In addition, these techniques reduce power consumption of the memory device 10 for several reasons. First, the number of serializer/deserializer (SerDes) links used for input/output for the memory device for performing the same number of data update operations is reduced. Second, the on-memory chip modify (e.g., Add) operations do not use power for both reading the counter and outputting its contents to the host device and then subsequently writing the updated results back to the memory location. In general, a memory device that employs the on-chip modify capabilities can reduce power consumption by approximately 50% and reduce the bandwidth requirements on the input/output ports by approximately 60%. The memory device 10 achieves a latency improvement for a memory update operation that is at least twice as fast as a memory update operation that requires sending the stored data off the memory chip for update by an external device and then writing the results back to the memory chip. Furthermore, the host device does not need to keep track of a read of a counter that has started the Read-Modify-Write operation where only the Read operation has been issued and the Write has not been committed. The interface to the host device is completely "clean" in this sense and sends an ACK after the Read-Modify-Write is completed.

Figure 4:
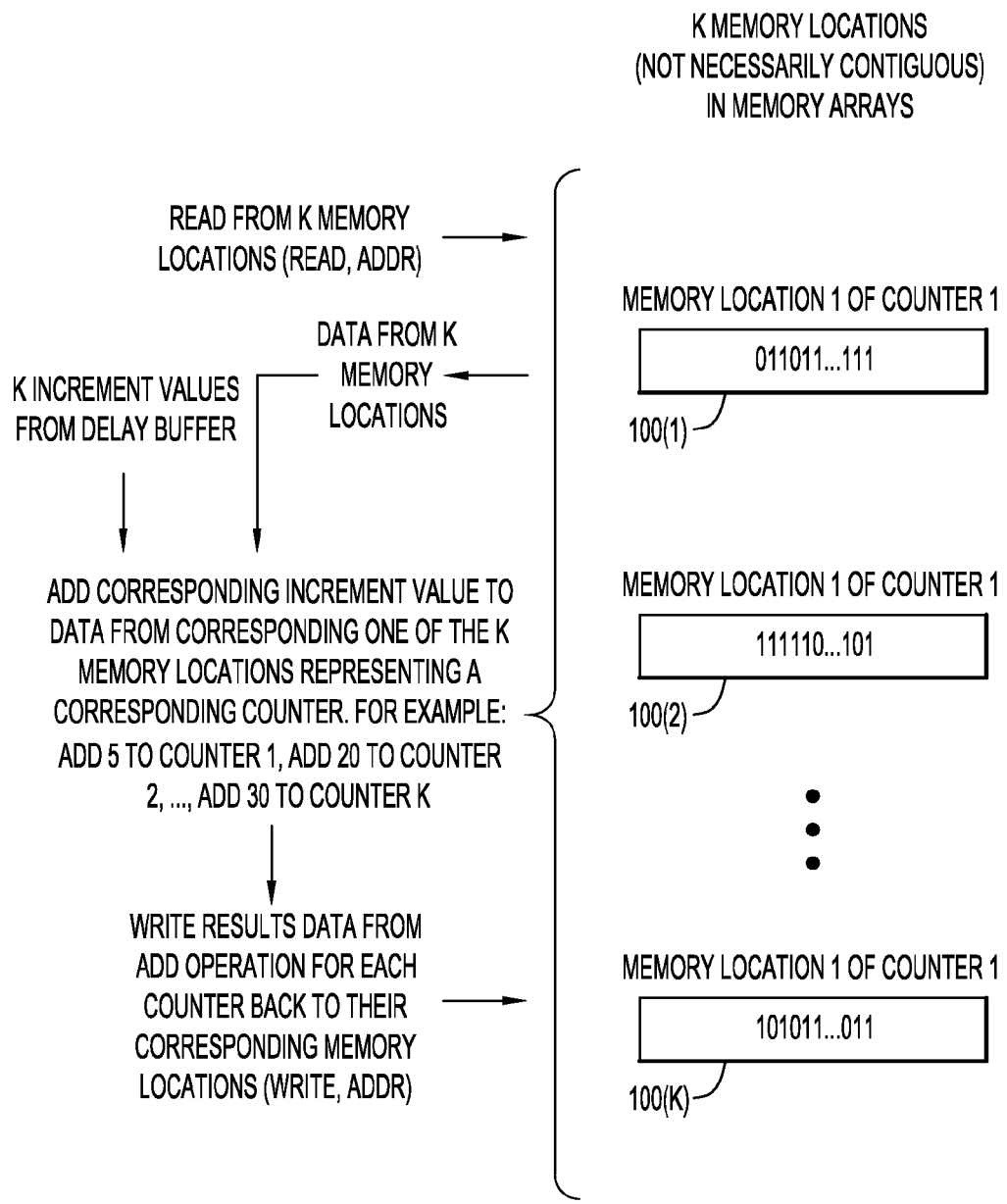
FIG. 4 is an example of a diagram that illustrates the flow of signals and data during the Read-Modify-Write operational sequence.

Reference is now made to FIG. 4 which pictorially represents K plurality of memory locations whose contents are modified internally by the memory device 10. The K memory locations storing, for example, data representing K counters, are shown at 100(1)-100(K). A Read cycle is executed for K memory locations in parallel such that K different addresses are supplied to the memory arrays 18. Data from the K memory arrays is retrieved, and then supplied to the modify circuit to perform K Add operations in parallel and to output K plurality of results data. For example, a counter 100(1) is a memory location storing the bit pattern 011011 . . . 111 representing a current counter value or state of counter 100 (1), counter 100(2) is a memory location storing the bit pattern 111110 . . . 101 representing a current counter value or state of counter 100(2), and counter 100(K) is a memory location storing the bit pattern 101011 . . . 011 representing a current counter value or state of counter 100(K). A command is then received at the memory device 10 to Add 5 to Counter 1 stored at memory location 1, Add 20 to Counter 2 stored at memory location, . . . , and Add 30 to Counter K stored at memory 1 location K. The modify circuit 28 adds the corresponding increment value to the data from the corresponding one of the K memory locations representing a corresponding counter. The results data from the Add operation is then written back to the memory locations for counters 100(1)-100 (K).

Figure 5:
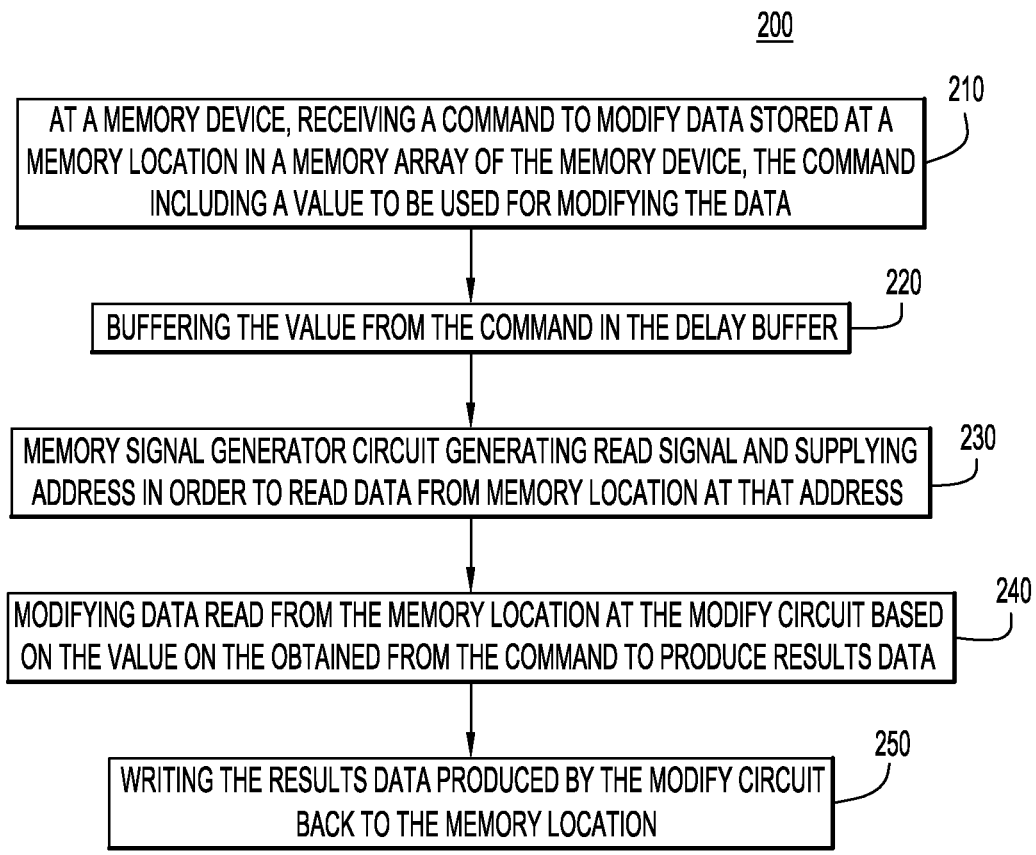
FIG. 5 is an example of a flow chart depicting the Read-Modify-Write operational sequence.

Turning to FIG. 5, a flow chart is now described for the operations 200 performed by the memory device 10 when executing the Read-Modify-Write operation sequence. For simplicity, this flow chart refers to the operations that are performed to modify contents at a single memory locations, e.g., update a counter, but it should be understood that, as described in connection with FIG. 4, several of these operations in parallel to modify contents stored at multiple memory locations.

At 210, a command is received at the memory device to modify data at a memory location in a memory array of the memory device, the command including a value to be used for modifying the data. The command comprises a plurality of bits and can take any of a variety of formats. The command includes an address to specify the memory location to be updated (e.g., the particular counter to be updated) and data used in updating the memory location (e.g., increment value). In one example, a bit, called a data valid bit, in the command is used to signify that the command carries data to be used in a modify operation. This bit is set for a normal Write command and is unset by the control circuit when it issues the corresponding write response to store the results of the modify operation back to memory. Furthermore, if multiple memory devices of the type shown in FIG. 1 are used in a daisy-chain configuration, then bits of the command are also allocated to identify which of the memory devices is to be accessed for a Read-Modify-Write operation.

At 220, the data contained in the command that represents the value to be used in the modify operation (e.g., increment value) is stored in the delay buffer.

At 230, the data at a memory location corresponding to an address contained in the command is read from to retrieve the stored data. The memory signal generator circuit 24 generates the read signal and supplies the address to the memory arrays 18 to execute the read operation.

At 240, the data read from the memory location is modified based on the value obtained form the command to produce results data. More specifically, the data read from the memory location is received at the memory signal receiver circuit 26. Then, the read data is and the buffered value from the delay buffer is supplied to the modify circuit 28 that modifies the data read from memory arrays using the buffered value.

At 250, the results data produced by the modify circuit 28 are written back to the memory location. To this end, the results data are supplied from the modify circuit 28 back to the memory signal generator circuit 24. The memory signal generator circuit 24 generates the write signal and supplies the address for that memory location to write the results data back to the memory location.

As explained above, the operations 210-250 may be performed for a plurality of memory location simultaneously. In this case, the receiving operation 210 comprises receiving a command to modify stored data at each of a plurality of memory locations simultaneously with corresponding values. The buffering operation 220 involves buffering a plurality of values to be used to modify the stored at corresponding ones of the plurality of memory locations. The reading operation 230 involves reading data from a plurality of memory locations in the memory arrays 18. The modifying operation 240 involves supplying the data from the plurality of memory locations together with corresponding values obtained from the command to the modify circuit, and modifying the data from the plurality of memory locations with corresponding values contained in the command with the modify circuit to produce a corresponding plurality of results data. In the case of an Add operation, the modifying operation involves adding one of the plurality of values obtained from the command to the data read from a corresponding one of the plurality of memory locations. The writing operation 250 then involves writing the plurality of results data output by the modify circuit to the plurality of memory locations.

Figure 6:
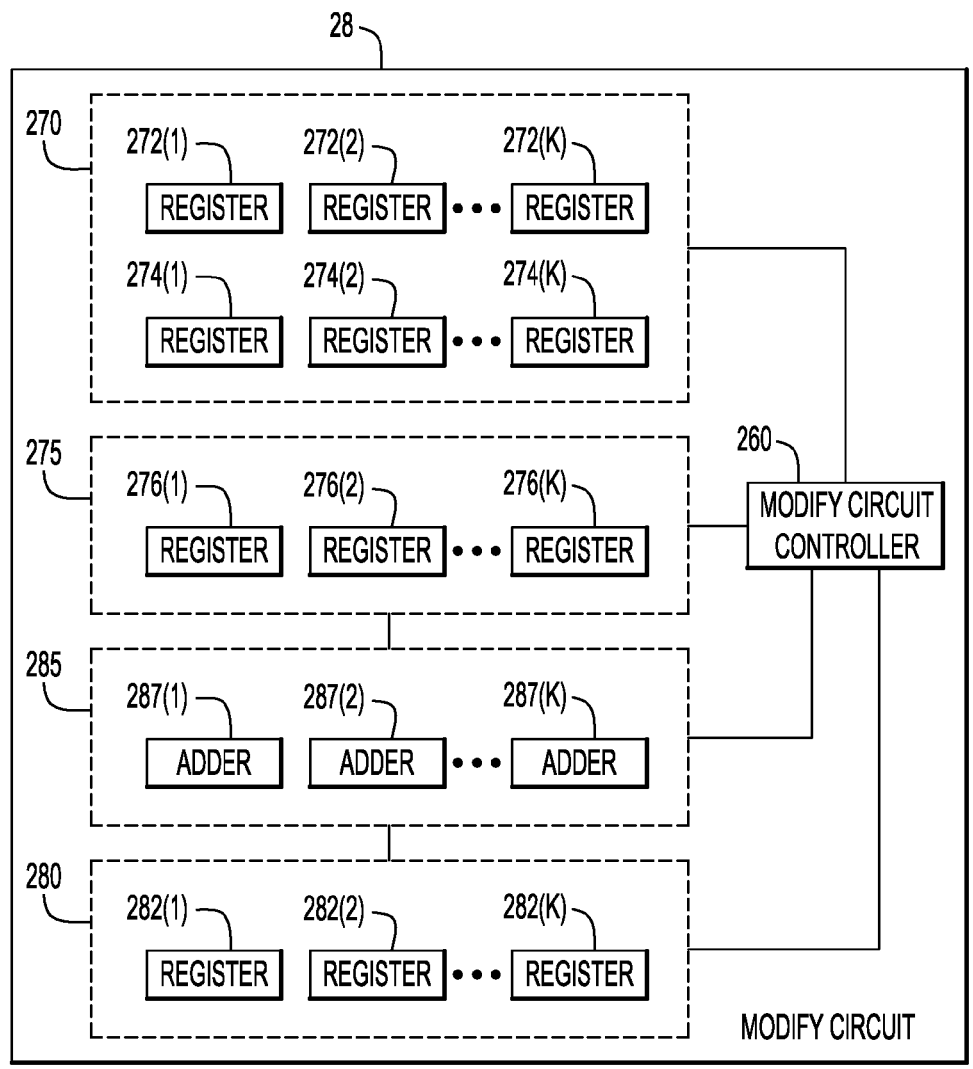
FIG. 6 is an example of a block diagram of a modify circuit used in the memory device shown in FIG. 1.

Turning now to FIG. 6, an example of a block diagram of the modify circuit 28 is now described. The modify circuit 28 is configured to handle some timing management associated with delivering the results of a modify operation (e.g., and add operation) back to the memory arrays synchronized to a Write strobe or pulse. In one example, the modify circuit 28 comprises a modify circuit controller 260, register banks 270, 275 and 280 and a bank of adders 285. The register bank 270 is configured to store addresses associated with pending Read-Modify-Write transactions and also addresses of new transactions to be executed, such as a Read operation, Write operation, etc. For example, registers 272(1)-272(K) are configured to store the addresses associated with the K Read-Modify-Write transactions that are pending and not yet completed while registers 274(1)-274(K) are configured to store the addresses of a newly received but yet to be executed sent of transactions. The register bank 275 comprises registers 276(1)-276(K) that are configured to store the operational values received in a command, e.g., K increment values associated with each of the K counters to be updated. The register bank 280 comprises registers 282(1)-282(K) that are configured to store the data read from the memory arrays to be updated with the operational values stored in the register bank 275. The bank of adders 285 comprises adder circuits 287(1)-287(K) that are configured to add the data of registers 276(1)-276(K) and with the data of registers 282(1)-282(K), respectively, to produce results data which, in one example, is written back to registers 282(1)-282(K) before ultimately being output to the memory signal generator circuit 24 for writing back to the memory array. The registers and adders shown in FIG. 6 may be implemented using any digital logic circuits now known or hereinafter developed that are suitable for their functions.

The modify circuit controller 260 is constructed of appropriate digital logic circuits configured to the control operations and flow of data between the components shown in FIG. 6. Timing diagrams for signals generated to control the flow of data into and out of the modify circuit 26 are described hereinafter in connection with FIGS. 7 and 8. One additional function that the modify circuit 28 performs in addition to the Read-Modify-Write operational sequence is to handle new transactions requests for access to memory locations that are associated with pending and unfinished Read-Modify-Write operations. Thus, whenever a new command is received from the host device 12 and converted by the command buffer 22 into a series of transactions, the addresses for the memory locations associated with those new transactions are stored in the registers 274(1)-274(K). The modify circuit controller 260 compares the addresses for the new transactions that are stored in registers 274(1)-274(K) with the addresses for the pending Read-Modify-Write operations stored in registers 272(1)-272(K). When an address in any one of the registers 272(1)-272(K) matches an address in any one of the registers 274(1)-274(K), the controller 260 determines that those new transactions need to be delayed slightly to allow the pending Read-Modify-Write operational sequence to finish and to write the results data back to the memory array. Consequently, the new transactions, at least one of which involves accessing a memory location that is also involved in a Read-Modify-Write operational sequence, do not prematurely access that memory location (or possibly multiple locations) and obtain invalid or outdated data. This is particularly useful when a Read command is received for one or more memory locations while a Read-Modify-Write operation pertaining to at least one of the same memory locations in the Read command, is still pending. The same is true for a Write operation that may be received by the memory device while a Read-Modify-Write operation pertaining to at least one of the same memory locations in the Write command, is still pending. This operational feature achieves the aforementioned "clean" interface to the host device so that the host device is completely independent and unaware of the potential conflict to multiple memory locations when a Read-Modify-Write operational sequence is being executed.

Figure 7:
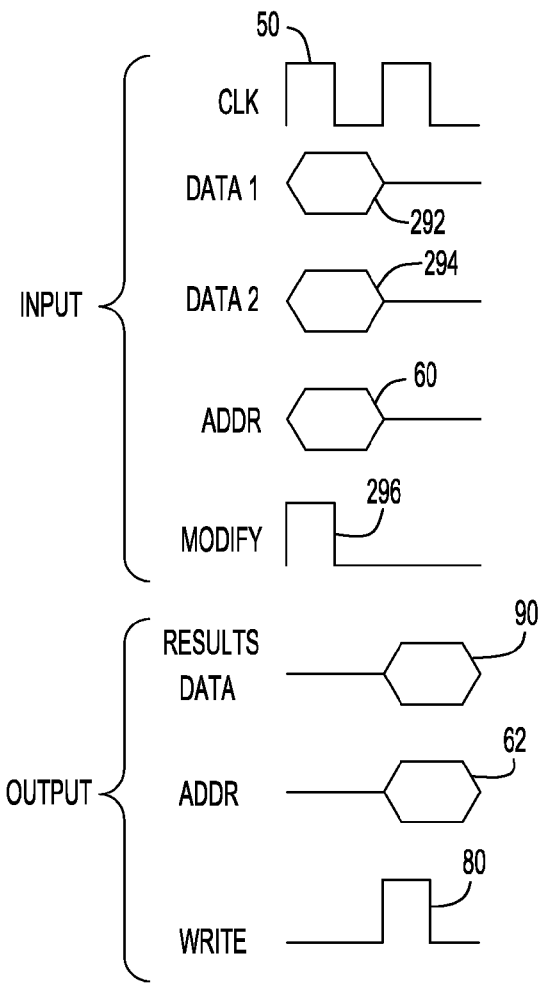
FIGS. 7 and 8 are examples of timing diagrams depicting the operations of the modify circuit during a Read-Modify-Write operational sequence.
Figure 8:
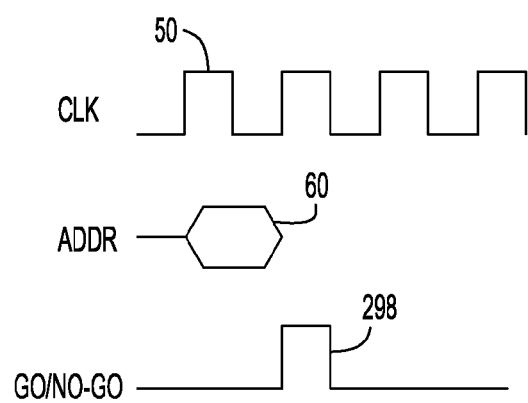

Turning now to FIGS. 7 and 8, timing diagrams depicting in more detail the operations of the modify circuit 28 are now described. Reference to FIG. 6 is also made in connection with the description of FIGS. 7 and 8. FIG. 7 illustrates the signal timing during the input and output phases of the modify circuit 28 during a Read-Modify-Write operational sequence. During the input phase, when the first instance of the Addr 60 occurs (as shown in FIG. 3), at 292, data is read from memory and stored in the registers 282(1)-282(K), designated as Data 1 in FIG. 7, and at 294, the operational (e.g., increment) data values from the host device command, designated as Data 2 in FIG. 7, are also clocked into registers 276(1)-276(K). Then, the controller 260 in the modify circuit 28 generates a modify pulse shown at 296 and at the falling edge of the modify pulse 296, the data from registers 282(1)-282(K) and the data from registers 276(1)-276(K) are supplied to the adders 287(1)-287(K). Data from register 282(1) is added to data from register 276(1) by adder 287(1), data from register 282(2) is added to data from register 276(2) by adder 287(2) and so on.

The output phase is now described. When the second instance of the Addr 62 and the Write strobe 80 occurs, the results data (stored back in registers 282(1)-282(K) are clocked out to be written back to the memory arrays. FIG. 7 shows that there is a one cycle latency between the input and output phases, but this is only an example. It is also possible that the input and output phases can occur during the same clock cycle.

FIG. 8 illustrates use of a Go/No-Go control signal shown at reference numeral 298 to handle a situation when incoming transactions are received for at least one memory location currently involved in a Read-Modify-Write operational sequence. The modify circuit controller 260 generates a pulse on Go/No-Go signal 298 (indicating a Go) when it compares the contents of registers 272(1)-272(K) with registers 274(1)-274(K) and finds no match, indicating that there are no memory locations in newly received transactions that overlap with memory locations in a pending and yet to be completed Read-Modify-Write operation. On the other hand, when the controller 260 finds at least one match, it does not generate a pulse on signal 298 in order to delay the memory access to a memory location that coincides with a memory location still undergoing a Read-Modify-Write operational sequence.

Figure 9:
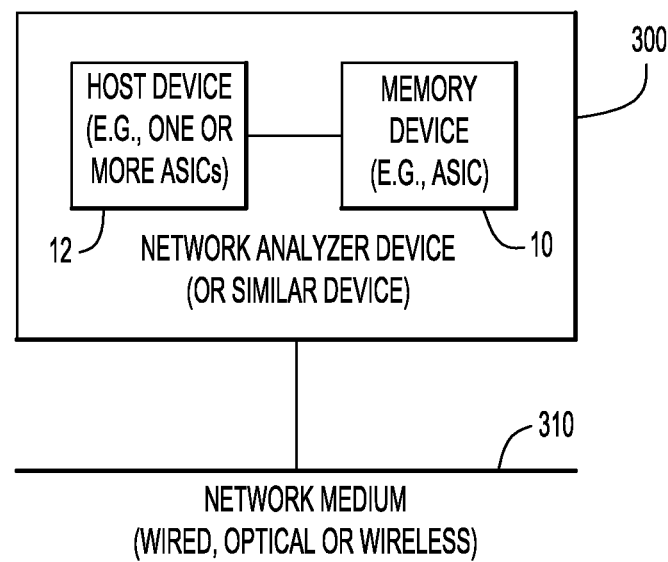
FIG. 9 is an example of a block diagram of a network analyzer device comprising the memory device shown in FIG. 1.

Reference is now made to FIG. 9. FIG. 9 illustrates an example of an application of the memory device 10. The on-board or in-built Read-Modify-Write operation in a eDRAM-based memory ASIC has substantial value in network statistic gathering applications that require higher density off-chip storage devices. Thus, in this example, the memory device 10 and the host device 12 are part of a network analyzer device 300. The network analyzer device 300 interfaces with a network medium shown at reference numeral 310, which network medium may be a wired network medium, optical, or wireless. The network analyzer device 300 is configured to perform a variety of measurements and statistics gathering based on traffic and other signals detected on the network medium 310. The network analyzer device 300 is configured to update counters that are stored in the memory device 10. The counter update process is performed by the memory device 10 using the Read-Modify-Write techniques described herein to reduce the input/output bandwidth requirements between host device 12 and the memory device 10. Other applications of the memory device 10 are in a network router device, switch device, network interface devices, gateway devices, bridge devices and any other equipment that is directly or indirectly involved in the forwarding and switching of traffic in a wired or wireless network. Thus, FIG. 9 depicts a combination or system (e.g., represented by the device 300) comprising the memory device 10 (comprising at least of one or more memory arrays 18 and one or more control circuits, e.g., control circuits 14(1)/14(2)), that is implemented in a separate integrated circuit chip from the host device 12. The host device 12 sends a command to update a value in the memory (e.g., increment a counter) such that the memory device 10 in a separate integrated circuit chip makes the update without the need to return any data read from memory back to the host device 12 in order to execute the update.

In sum, a method is provided comprising: at a memory device, receiving a command to modify data stored at a memory location in a memory array of the memory device, the command including a value to be used for modifying the data; in the memory device, reading data from the memory location; modifying the data read from the memory location with a modify circuit in the memory device based on the value obtained form the command to produce results data; and writing the results data produced by the modify circuit back to the memory location.

In addition, an apparatus is provided comprising a memory array comprising a plurality of memory cells configured to store data; an input/output interface circuit configured to receive a command to access data stored in the memory array; and a control circuit configured to be coupled to the input/output interface circuit and configured to generate memory control signals from the command to be supplied to the memory array to read data from the memory array and write data back to the memory array, the control circuit comprising a modify circuit configured to modify data read from the memory array based on a value contained in the command to produce results data and to write the results data back to the memory array.

Further still, an apparatus is provided comprising means for storing data in a plurality of memory cells; means for receiving a command to access data in the means for storing; and controlling means for generating memory control signals from the command to be supplied to the means for storing to read data from the means for storing and write data back to the means for storing, the controlling means comprises means for modifying data read from the means for storing based on a value contained in the command to produce results data and to write the results data back to the means for storing.

The above description is intended by way of example only.

What is claimed is:

1. A method comprising:
at a memory device, receiving a command to modify data stored at a memory location in a memory array of the memory device, wherein the command is received from a host device and includes an increment value to be used to increment a value represented by the data stored at the memory location;
in the memory device, reading data from the memory location;
supplying the data read from the memory location together with the increment value to a modify circuit;
modifying the data read from the memory location with the modify circuit in the memory device by adding the increment value to the value represented by the data read from the memory location to thereby increment a counter represented by the data stored at the memory location with the increment value to produce results data; and
writing the results data produced by the modify circuit back to the memory location.

2. The method of claim 1, wherein receiving comprises receiving the command to modify stored data at each of a plurality of memory locations simultaneously with corresponding values, and wherein reading comprises reading data from a plurality of memory locations in the memory array.

3. The method of claim 2, wherein supplying comprises supplying the data from the plurality of memory locations together with corresponding values obtained from the command to the modify circuit, and wherein modifying comprises modifying the data from the plurality of memory locations with corresponding values contained in the command to produce a corresponding plurality of results data.

4. The method of claim 3, wherein writing comprises the plurality of results data output by the modify circuit to the plurality of memory locations.

5. The method of claim 4, wherein modifying comprises adding one of the plurality of values obtained from the command to the data from a corresponding one of the plurality memory locations.

6. The method of claim 1, and further comprising storing data representing the increment value obtained from the command in a buffer and supplying the data representing the increment value to the modify circuit after the data is read from the memory location, and writing comprises supplying the results data back to the memory location synchronized with respect to a write signal.

7. An apparatus comprising:
a memory array comprising a plurality of memory cells configured to store data;
an input/output interface circuit configured to receive a command to access data stored in the memory array, wherein the command includes an increment value to be used to increment a value represented by data stored in the memory array; and
a control circuit configured to be coupled to the input/output interface circuit and configured to generate memory control signals from the command to be supplied to the memory array to read data from the memory array and write data back to the memory array, the control circuit comprising a modify circuit configured to modify data read from the memory array by adding the increment value to a value represented by the data read from the memory array to thereby increment a counter represented by the data stored in the memory array with the increment value to produce results data and to write the results data back to the memory array.

8. The apparatus of claim 7, wherein control circuit comprises a memory signal generator circuit configured to generate memory control signals including read signals, write signals and addresses to be supplied to the memory array, and a memory signal receiver circuit configured to receive data read from the memory array.

9. The apparatus of claim 8, and further comprising a buffer circuit that is configured to store data representing the increment value obtained from the command.

10. The apparatus of claim 9, wherein the buffer circuit is configured to be coupled to the memory signal generator circuit and the memory signal receiver circuit, and wherein the memory signal receiver circuit is configured to output the data read from the memory array to the modify circuit in sufficient time prior to an occurrence of a write signal generated by the memory signal generator circuit so that the modify circuit can modify the data read from the memory array with the data representing the increment value stored in the buffer and output the results data to the memory signal generator circuit for writing back to the memory array synchronized with respect to the write signal.

11. The apparatus of claim 7, wherein the data stored in the memory array represents a state of a counter, and wherein the modify circuit is configured to increment a value represented by the data stored in the memory array by the increment value obtained from the command.

12. The apparatus of claim 7, wherein the input/output interface circuit is configured to perform serialize/deserialize operations with respect to incoming commands and outgoing responses and/or data.

13. In combination, the apparatus of claim 7 and a host device configured to supply the command, and wherein the memory array and control circuit are implemented in a separate integrated circuit chip from the host device.

14. An apparatus comprising:
means for storing data in a plurality of memory cells;
means for receiving a command to access data in the means for storing, wherein the command is received from a host device and includes an increment value to be used to increment a value represented by data stored in the memory array; and controlling means for generating memory control signals from the command to be supplied to the means for storing to read data from the means for storing and write data back to the means for storing, the controlling means comprises means for modifying data read from the means for storing by adding the increment value to a value represented by the data read from the means for storing to thereby increment a counter represented by the data stored by the means for storing with the increment value to produce results data and to write the results data back to the means for storing.

15. The apparatus of claim 14, wherein the controlling means comprises means for buffering data representing the increment value obtained from the command.

16. The apparatus of claim 15, the controlling means comprises a memory signal generator circuit configured to generate memory control signals including read signals, write signals and addresses to be supplied to the means for storing, and a memory signal receiver circuit configured to receive data read from the memory array.

17. The apparatus of claim 16, wherein the means for buffering is configured to be coupled to the memory signal generator circuit and the memory signal receiver circuit, and wherein the memory signal receiver circuit is configured to output the data read from the memory location to the modify circuit in sufficient time prior to an occurrence of a write signal generated by the memory signal generator circuit so that the modify circuit can modify the data read from the memory location with the data representing the increment value stored in the buffer and output the results data to the memory signal generator circuit for writing back to the memory location synchronized with respect to the write signal.

18. The apparatus of claim 14, wherein the data stored in the memory location of the means for storing represents a state of a counter, and wherein the means for modifying is configured to increment a value represented by the data stored in the memory location by the increment value obtained from the command.

* * * * *